(12) United States Patent
Ishihara et al.

(10) Patent No.: US 6,593,977 B2
(45) Date of Patent: *Jul. 15, 2003

(54) IC CARD APPARATUS HAVING PATTERNED INSULATING LAYER FORMED BETWEEN GATE INSULATING FILM AND SEMICONDUCTOR LAYER EXCEPT FOR CHANNEL REGION AND METHOD OF MANUFACTURE

(75) Inventors: Shingo Ishihara, Hitachi (JP); Masatoshi Wakagi, Hitachi (JP); Masahiko Ando, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/949,091

(22) Filed: Sep. 10, 2001

(65) Prior Publication Data

US 2002/0012080 A1 Jan. 31, 2002

Related U.S. Application Data

(63) Continuation of application No. 09/526,557, filed on Mar. 16, 2000, now Pat. No. 6,300,988.

(30) Foreign Application Priority Data

Mar. 16, 1999 (JP) .............................. 11-69529

(51) Int. Cl.[7] .................. G02F 1/136; G02F 1/1333; G02F 1/13; H01L 29/04
(52) U.S. Cl. ................. 349/43; 349/138; 349/187; 257/59
(58) Field of Search .................... 349/42, 43, 138, 349/44, 45, 46, 187; 257/59, 72, 350, 347

(56) References Cited

U.S. PATENT DOCUMENTS

| | | | | |
|---|---|---|---|---|
| 5,294,811 A | * | 3/1994 | Aoyama et al. | 257/59 |
| 5,475,246 A | * | 12/1995 | Wei et al. | 257/291 |
| 5,539,219 A | * | 7/1996 | den Boer et al. | 257/59 |
| 5,796,121 A | * | 8/1998 | Gates | 257/40 |
| 5,953,583 A | * | 9/1999 | Ban et al. | 257/506 |
| 6,025,605 A | * | 2/2000 | Lyu | 257/353 |
| 6,091,465 A | * | 7/2000 | Lyu | 349/43 |
| 6,130,443 A | * | 10/2000 | Hong et al. | 257/347 |
| 6,140,668 A | * | 10/2000 | Mei et al. | 257/57 |
| 6,458,635 B2 | * | 10/2002 | Yamazaki et al. | 438/149 |

* cited by examiner

*Primary Examiner*—Tarifur R. Chowdhury
(74) *Attorney, Agent, or Firm*—Antonelli, Terry, Stout & Kraus, LLP

(57) ABSTRACT

The present invention provides a thin film transistor, wherein the semiconductor channel region is patterned. Gate electrodes 102, gate insulating film 103, source electrodes 104, and drain electrodes 105 are formed on a glass substrate 101. A patterned insulating film is formed thereon, and a part of the film in the region 110 on the gate electrode is removed. An organic semiconductor film is formed thereon by vapor deposition. The organic semiconductor film 107 in the region 110, where the patterned insulating film is removed, becomes a channel region, and is separated from the organic semiconductor film 108 on the patterned insulating film 106. Therefore, the organic semiconductor channel region is patterned to have the same size as the gate electrode. In accordance with the present invention, a thin film transistor, wherein the semiconductor region is patterned precisely, becomes available.

19 Claims, 7 Drawing Sheets

IC CARD APPARATUS HAVING PATTERNED INSULATING LAYER FORMED BETWEEN GATE INSULATING FILM AND SEMICONDUCTOR LAYER EXCEPT FOR CHANNEL REGION AND METHOD OF MANUFACTURE

This application is a Continuation application of application Ser. No. 09/526,557, filed Mar. 16, 2000 now U.S. Pat. No. 6,300,988.

BACKGROUND OF THE INVENTION

The present invention relates to a liquid crystal display apparatus, particularly, to an active matrix liquid crystal display apparatus and IC (Integrated Circuit) cards.

Currently, an active matrix liquid crystal display apparatus using active elements, represented by TFT (Thin Film Transistor) devices, have been widely used as monitors for personal computers and work stations, in view of their high image quality, which is comparable to a CRT (Cathode Ray Tube), their low power consumption, which is less than a CRT, and saving space. However, an active matrix liquid crystal display apparatus is expensive in comparison with a CRT, and the lowering of its price is required in order to provide for wider use of this apparatus.

As one of the methods for lowering its price, application of an organic thin film transistor (organic TFT), which can be manufactured readily, to the active element has been proposed. However, both a plasma Chemical Vapor Deposition (CVD) apparatus for manufacturing insulating layers and semiconductor layers of the current amorphous silicone TFT and a spattering apparatus for manufacturing electrodes are very expensive. Furthermore, the CVD method requires a high temperature in the range of 230–350° C. for forming films, and the throughput of the apparatus is low, because the apparatus requires frequent maintenance, such as cleaning and the like. On the other hand, an application apparatus and a vapor deposition apparatus for manufacturing an organic TFT is cheap in comparison with the cost of a CVD apparatus and a spattering apparatus. The temperature for forming films using the above apparatus is lower, and their maintenance is easier in comparison with the CVD apparatus and the spattering apparatus. Therefore, a significant decrease in production cost can be realized by using an organic TFT for a liquid crystal display apparatus.

Generally, an organic TFT is composed of a glass substrate, gate electrodes, a gate insulating film, source electrodes, drain electrodes, and an organic semiconductor film. The amount of charge at a boundary between the gate insulating film and the organic semiconductor can be altered from excessive to deficient, or vice versa, by varying the voltage applied to the gate electrode. Switching is performed by varying the value of drain current flowing through the source electrode/the organic semiconductor/the drain electrode.

A method for manufacturing an organic TFT using a sexithiophene oligomer vapor deposition film as the organic semiconductor film was disclosed in JP-A-8-228035 (1996). In (Y-Y, Lin, D. J. Gundlach, S. F. Nelson, and T. N. Jackson; IEEE Transactions on Electron Devices, Vol. 44, No. 8, p 1325–1331 (1997)), a method of manufacturing a high performance organic TFT using pentacene vapor deposition film as the organic semiconductor film was disclosed. JP-A-8-191162 (1996) disclosed a method for manufacturing an organic TFT using organic materials for the semiconductor film, source electrodes, drain electrodes, and gate electrodes, wherein the gate insulating film is made of an insulating polymer having cyano-groups.

In accordance with JP-A-8-228035 (1996) and JPA-10-125924 (1998), the organic semiconductor films were formed by vapor deposition methods, but pattern formation of the semiconductor was not described. For instance, when the pattern is formed using a metallic mask made of molybdenum, the minimum size of the pattern becomes approximately 100 $\mu$m, which is larger than a pixel size ($10\times30$ $\mu m^2$) in the current liquid crystal display apparatus. When conventional lithography (photolithography) is used, deterioration by carrier injection into the semiconductor layer and the like in an annealing process for removing a polar solvent or a solvent used for resist materials becomes a concern. A two terminal electron element having an organic semiconductor layer, wherein a pattern was formed between two parallel electrodes on a substrate, was disclosed in JP-A-2-239663 (1990). In accordance with JP-A-2239663 (1990), a patterned insulating film, wherein electrode portions were removed, was formed on a lower electrode, and an organic semiconductor film having the same size as the lower electrode was formed using the lower electrode. However, the material was restricted to an organic material which would be an electron donor, such as tetracyanoquinonedimethane and the like, and other materials can not be used. Furthermore, the technique can not be applied to three terminal elements, such as a TFT and the like.

SUMMARY OF THE INVENTION

With respect to a conventional organic TFT, the organic semiconductor film can not be manufactured finely, and the area of the organic semiconductor film is larger than the gate electrodes. Therefore, an off-current caused by wraparound is increased. On account of the large area of the organic semiconductor film, the organic semiconductor film can not be covered by a light shielding layer, and off current with carriers generated by photo excitation is increased. As a result, an on/off ratio indicating the performance of the switching element is decreased. If the on/off ratio is decreased, for instance, when the device is used in a liquid crystal display active element, the applied voltage to the liquid crystal is decreased because the current flows even in an off condition, and the holding characteristics are deteriorated.

In accordance with a decrease in the off-current, the amount of gate voltage variation (S-value) necessary for increasing the drain current by one order, which is an index indicating the speed of the switching action, is increased, and the TFT characteristics are deteriorated.

If the above organic TFT is used for the active elements in the liquid crystal display apparatus, writing into a liquid crystal pixel may be produced by an adjacent signal line and lowering of the contrast results, because a TFT is composed of an organic semiconductor film between the drain electrode and the adjacent signal line.

One of the objects of the present invention is to provide a method of forming patterns, which makes it possible to avoid deterioration the TFT characteristics of the organic TFT element and a lowering of the contrast in the liquid crystal display apparatus due to the influence of an adjacent signal line.

In an organic thin film transistor comprising a substrate, gate electrodes, gate insulating layers, source electrodes, drain electrodes, and an organic semiconductor layer, the above object can be realized by making channel regions of the organic semiconductor film formed as patterns of the same size as the gate electrodes via the insulating layer which is formed as a pattern between the gate insulating layer and the semiconductor layer.

In accordance with the present invention, a photosensitive insulating film can be used instead of the insulating layer.

The present invention is characterized by use of such an organic thin film transistor as an active element in an active matrix liquid crystal display apparatus.

The organic TFT referred to here comprises conductive gate electrodes, gate insulating layers, source electrodes and drain electrodes which are arranged relative to each other horizontally with an interval between them, and an organic semiconductor layer. The organic TFT operates with either of an accumulating condition and a vacant condition depending on the polarity of the voltage applied to the gate electrodes.

The gate electrode relating to the present invention is arranged in the region between the source electrode and the drain electrode, and above or beneath the region having a longitudinal direction of the source/drain electrode as one side. The size of the gate electrode is desirably in the range from 1.1 times to 1.2 times of respective sides of the above regions in consideration of the position adjustment. As the material of the electrode, an organic material, such as polyaniline, polythiophene, and the like, or a conductive ink, which can be readily formed in the shape of the electrode by a coating method, is desirable. It is also desirable to use a metallic material, such as gold, platinum, chromium, palladium, aluminum, indium, molybdenum, nickel, and others, which can be formed in the shape of the electrode by conventional photolithography; an alloy made of the above metals; and an inorganic material, such as polysilicone, amorphous silicon, tin oxide, indiumoxide, indium-tin-oxide (ITO), and others. Naturally, the invention is not restricted to the above materials, and at least two kinds of the above materials can be used concurrently.

As the material for the gate insulating film of the present invention, an organic material, such as polychloropyrene, polyethylene terephthalate, polyoxymethylene, polyvinyl chloride, polyvinylidene fluoride, cyanoethyl-pullulan, polymethylmethacrylate, polysulfon, polycarbonate, polyimide, and others, which can be formed in the shape of the electrode by a coating method in the same manner as the material for the gate electrode, is desirable. Furthermore, an inorganic material, such as $SiO_2$, $SiN_X$, $Al_2O_3$, and others, which can be formed in the shape of the electrode by conventional photolithography, is desirable. Naturally, the invention is not restricted to the above materials, and at least two kinds of the above materials can be used concurrently.

As the material for the source electrode and the drain electrode of the present invention, a metal having a large work function is desirable in order to make ohmic contact with the semiconductor layer, because most of the organic semiconductor is a P-type semiconductor, wherein carriers for transporting charges are holes. Practically, gold and platinum are desirable, but the invention is not restricted to these materials. In a case when a dopant is doped onto the surface of the semiconductor layer with a high density, an energy barrier between the metal and the semiconductor is reduced and the carriers come to be able to tunnel it. Therefore the metallic materials described previously as the materials for the gate electrode can be used.

The patterned insulating film of the present invention is composed in a manner such that the patterned insulating film is formed between the gate insulating film and the organic semiconductor layer, and regions of the insulating film above or beneath the gate electrode are removed. The area of the region of the insulating film to be removed desirably has the same size as the size of the gate electrode. The patterned insulating film has a function as a mask pattern when forming the semiconductor film. That is, the semiconductor layer can be formed so as to contact the gate insulating film only in the regions, which operate as channel regions, by accumulating the semiconductor film onto the patterned insulating film after forming the patterned insulating film. The semiconductor film is formed via the patterned insulating film (together with the source electrode and the drain electrode in the regions where these electrodes are formed), in all the regions, except the regions where the insulating film is removed above or beneath the gate electrodes. Accordingly, the semiconductor film can be formed precisely in the channel regions.

The photosensitive insulating film of the present invention has concurrently a property to form a photo-pattern itself. Therefore, no resist material is required, and its manufacturing process can be shortened. As the material for the patterned insulating film, an insulating material different from the material for the gate insulating film must be used, in order to perform a selective etching operation.

Practical examples of the materials for the insulating film are inorganic materials such as $SiO_2$, $SiN_X$, $Al_2O_3$, and others, and organic materials such as polychloroprene, polyethylene terephthalate, polyoxymethylene, polyvinyl chloride, polyvinylidene fluoride, cyanoethyl-pullulan, polymethylmethacrylate, polysulfon, polycarbonate, polyimide, and others, but the insulating film is not restricted to the above materials.

As the materials for the organic semiconductor of the present invention, aromatic compounds having a n-electron conjugated group, aliphatic compounds, organic pigments, organic silicone compounds and others are desirable. Practically, pentacene, tetracene, thiophene oligomaer derivatives, phenylene derivatives, phthalocyanine compounds, polyacetylene derivatives, polythiophene derivatives, cyanine pigments, and others can be used as the materials for the organic semiconductor, but the invention is not restricted to the above materials.

The method for manufacturing the organic TFT of the present invention is characterized in comprising the steps of: forming gate electrodes, a gate insulating layer, source electrodes, and drain electrodes on a glass substrate; forming an insulating film thereon; removing the insulating film on the gate electrodes; and forming a semiconductor film thereon. As the method for manufacturing the organic TFT of the present invention, a plasma CVD method is used for the inorganic insulating film and others, and a spattering method is used for the metallic film, tin oxide, indium oxide, ITO and others. For forming a pattern, conventional photolithography, and a dry etching method or wet etching method, are used. An example of the manufacturing methods is disclosed in, S. Matsumoto: "Liquid crystal display technology-active matrix LCD" chapter 2, Sangyo tosyo (1996). As a method for manufacturing a thin film using conductive organic materials, conductive ink, insulating organic materials, and semiconductor organic materials as a raw material, a spin coating method, a casting method, a dipping method, a vacuum deposition method, and others can be used.

In accordance with the active matrix liquid crystal display apparatus referred to here, the active matrix element is attached to every pixel composing the display portion, and an voltage is applied to the liquid crystal via the active matrix element. Accordingly, its driving method is as follows.

An active element, such as TFT and others, is arranged respectively at every crossing point of a n×m matrix of lines with n rows of scanning lines and m columns of signal lines; the gate electrode of the TFT is connected to the scanning line, the drain electrode is connected to the signal line, and the source electrode is connected to the pixel electrode. Address signals are supplied to the scanning line, display signals are supplied to the signal line, and the liquid crystal on the pixel electrode is operated via a TFT switch, which is controlled by the address signals overlapped with on/off signals. By using an organic TFT as the switching element, the manufacturing process is simplified, and the price can be lowered.

Hitherto, the explanation has been given concerning use of an organic TFT, but the TFT structure and the manufacturing method of the present invention can be applied to a TFT having a semiconductor layer made of materials other than organic materials.

BRIEF DESCRIPTION OF THE DRAWINGS

These and other objects, features and advantages of the present invention will be understood more clearly from the following detailed description when taken with reference to the accompanying drawings, wherein.

DETAILED DESCRIPTION OF THE PREFERRED EMBODIMENTS (Embodiment 1)

Hereinafter, details of the organic TFT of the present invention is explained referring to FIG. 1 and FIG. 2.

Figure 1A:
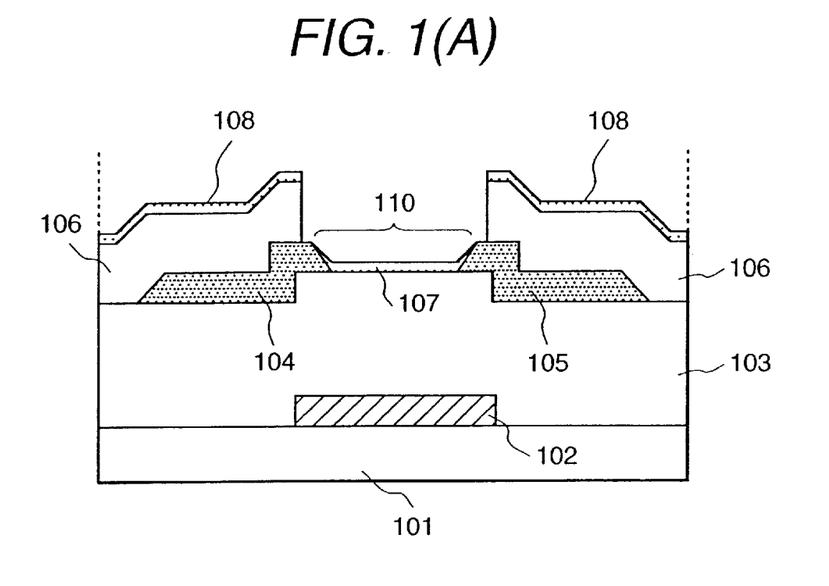
FIG. 1(A) is a schematic cross sectional view and FIG. 1(B) is a schematic plan view of an organic TFT element representing a first embodiment of the present invention.

FIG. 1(A) is a schematic cross sectional view of the organic TFT element of embodiment 1 of the present invention. FIG. 1(B) is a schematic plan view of the organic TFT element of embodiment 1 of the present invention. The organic TFT element has a glass substrate 101, a gate electrode 102, a gate insulating film 103, a source electrode 104, a drain electrode 105, a patterned insulating film 106, a conjugated sexithiophene oligomer (a-6T) organic semiconductor film 107 in the channel region, a-6T (a-6T) organic semiconductor film 108 in the non-channel region, an opening 109 for taking out the gate electrode, and a region 110 where the patterned insulating film is removed. That is, the patterned insulating film 106 is composed so as to be formed between the gate insulating film 103 and the organic semiconductor layer (organic semiconductor film 107), and the insulating film in the region 110 above or beneath (in the present embodiment, above) the gate electrode 102 is removed. The region 110, where the insulating film has been removed has the same size as the channel region of the gate electrode 102.

Figure 1B:
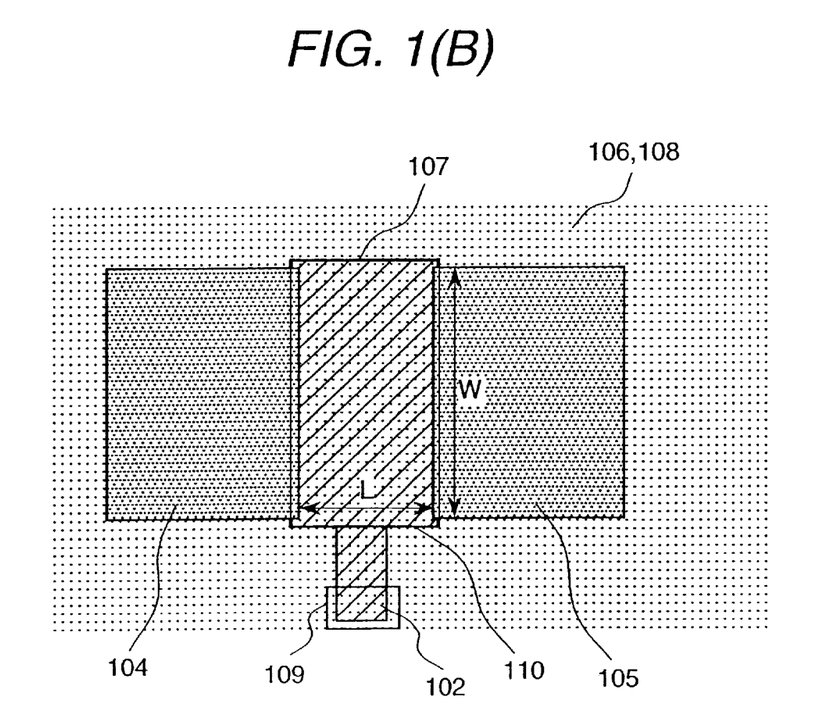

As indicated in FIG. 1(B), the source electrode 104 and the drain electrode 105 each have a width of W and are arranged with an interval L. The gate electrode 102 is led out from one side and is connected to the outside via the opening for taking out the gate electrode 109. The organic semiconductor film 107 is composed so as to contact the slanting portion at the end of the source electrode 104 and the drain electrode 105.

Figure 2A:
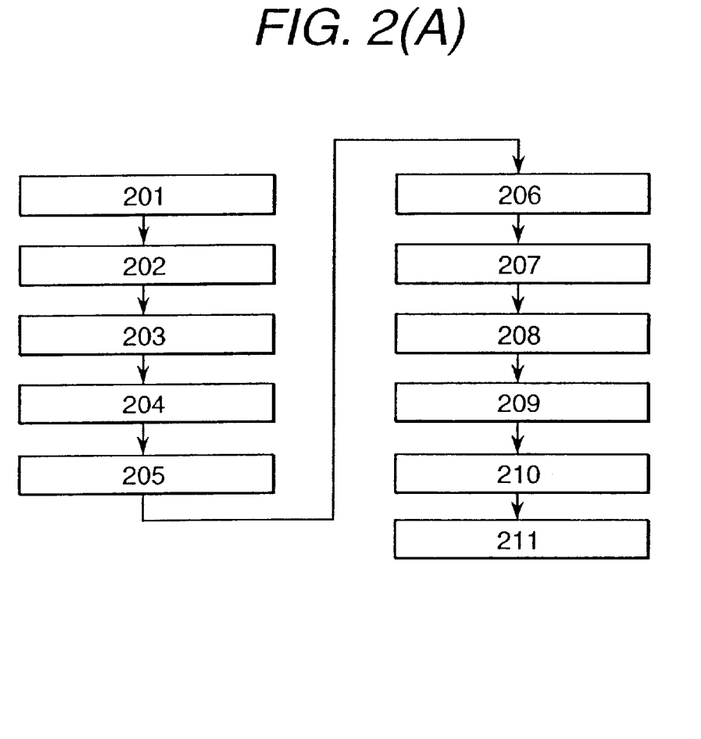
FIG. 2(A) and FIG. 2(B) are flow diagrams illustrating the process of manufacture of the organic TFT element representing the first embodiment.
Figure 2B:
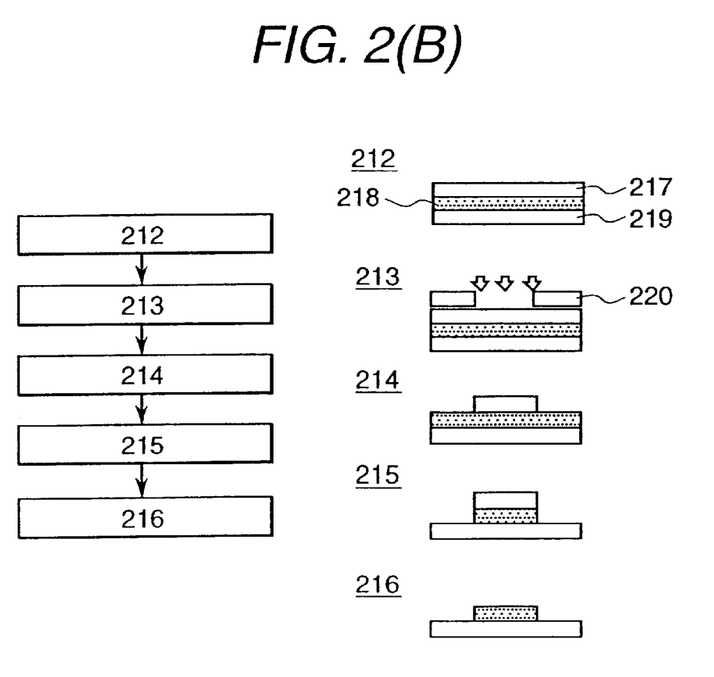

The steps (steps 201–211) in the manufacture of the organic TFT, the composition of which is indicated in FIG. 1(A), are diagrammatically illustrated in FIG. 2(A). Steps of the photolithography used in the process indicated in FIG. 2(A) are illustrated diagrammatically in FIG. 2(B) (steps 212–216). The left column of FIG. 2(B) indicates the flow of the steps, and the right column indicates the corresponding changes of the structure. In FIG. 2(B), the reference numeral 217 indicates a resist film, 218 denotes a manufactured film, 219 denotes the substrate, and 220 denotes a photomask.

A CrMo film of approximately 150 nm in thickness is formed on the glass substrate 101 made of Corning 1737 glass (step 201). The gate electrodes 102 are formed by patterning the CrMo film by the steps of the photolithography indicated in FIG. 2(B) (step 202).

In accordance with the steps of the photolithography, resist film 217 is formed on the manufactured film to be patterned using a spin coating method (step 212), the resist is sensitized by irradiating it with ultraviolet rays (UV) through the photomask 220 (step 213), and the mask pattern is transcribed to the resist film by developing and post-baking (step 214). Subsequently, the portions uncovered by the resist are removed using a wet or dry etching method (step 215), and the resist is peeled off (step 216).

The gate insulating film 103 composed of a silicone dioxide ($SiO_2$) film of 300 nm in thickness is formed on the glass substrate 101, whereon the gate electrodes 102 have been formed, by a CVD method (step 203).

The gate insulating film has a structure, wherein the gate insulating film has a protrusion of the same width as the width of the gate electrode 102 in the presence of the gate electrode 102. The raw material gas used for forming the $SiO_2$ film is as follows: $SiH_4+N_2O$. The opening for taking out the gate electrode 109 is formed in the $SiO_2$ film by photolithography (step 204). A CrMo film of 20 nm in thickness is formed thereon by spattering method, and the source electrodes 104 and the drain electrodes 105 are formed by forming a pattern by photolithography (steps 205, 206). An Au film of 150 nm in thickness is formed thereon by a vapor deposition method, and the source electrodes 104 and the drain electrodes 105 are formed by forming the pattern on the Au film by photolithography. The CrMo film is used in order to increase the adhesiveness of the Au film with the $SiO_2$ film. The size of each of the source electrode and the drain electrode is 1000×50 $\mu m^2$. In this case, the channel width W becomes 1000 $\mu m$. The channel length L, which corresponds to the gap between the source electrode and the drain electrode, is 50 $\mu m$.

In accordance with the conventional organic TFT element, an organic semiconductor film is formed thereon.

However, in accordance with the present invention, a silicone nitride (SiN$_x$) film of 500 nm in thickness is formed thereon by CVD method (step 209). The raw material gas used for forming the SiN$_x$ film is as follows: SiH$_4$+NH$_3$+N$_2$. A part of the SiN$_x$ film region is removed by photolithography (step 210). The position of the removed region 110 is concentric with the region (W×L) between the source electrode and the drain electrode as indicated in FIG. 1(B), and the size of the removed region is 1.1 times the channel length L and channel width W, respectively. A sexithiophene oligomer (a-6T) organic semiconductor film of 100 nm in thickness is formed thereon by a vacuum vapor deposition method (step 211). The manufacturing condition of the a-6T organic semiconductor film is as follows: The ultimate vacuum in the chamber of the vapor deposition apparatus is 3–5×10$^{-6}$ torr. The organic TFT is completed by placing a powder of the a-6T on a boat made of Mo for resistance heating, and the vapor deposition is performed by heating the boat at approximately 300° C.

In accordance with the present embodiment, the a-6T organic semiconductor film 107 in the channel region formed in the SiN$_x$ film removed region 110 becomes a channel region, where the drain current flows, by contacting the source electrode 104, the drain electrode 105, or the gate insulating film 103. Because the SiN$_x$ film removed region 110 is formed by an anisotropic etching method, the angle formed by a plane perpendicular to the surface of the substrate of the removed region and the surface of the source/drain electrode is close to 90 degrees. Accordingly, as indicated in FIG. 1(A), the a-6T organic semiconductor film 108 on the SiN$_x$ film 106 becomes separated from the a-6T organic semiconductor film 107 forming the channel region, and the channel region becomes the same size as the gate electrode. As a result, the wraparound current between the source electrode and the drain electrode is decreased, and the off-current is as small as $10^{-11}$ to $10^{-12}$ A. The S-value, which is an index indicating the speed of the switching action, could be decreased from 15 to 3. Because the effective size of the a-6T organic semiconductor film has been decreased, photoelectric current with carriers generated by photo excitation can be suppressed.

The size of the channel region of the present embodiment became 1000×50 $\mu$m$^2$, which could not be fabricated by a pattern forming method using a conventional metallic mask for the vapor deposition mask. In accordance with the present method for forming a pattern, the active matrix element having a necessary size as the element for the liquid crystal display apparatus can be realized, because photolithography is used.

As a result, in accordance with the present invention, the organic semiconductor layer, which has been vapor deposited on the whole surface of the substrate, is patterned in the same size as the gate electrode by interposing a patterned insulating layer between the source/drain electrodes and the organic semiconductor film. In this way, the wraparound current between the source/drain electrodes and the off-current by photo-excitation can be suppressed, and high performance organic TFT elements can be obtained.

(Embodiment 2)

Next, an embodiment of the TFT element of the present invention, wherein a photosensitive organic insulating film is used as the patterned insulating film, will be explained with reference to FIG. 3(A), FIG. 3(B), FIG. 4(A) and FIG. 4(B).

Figure 3A:
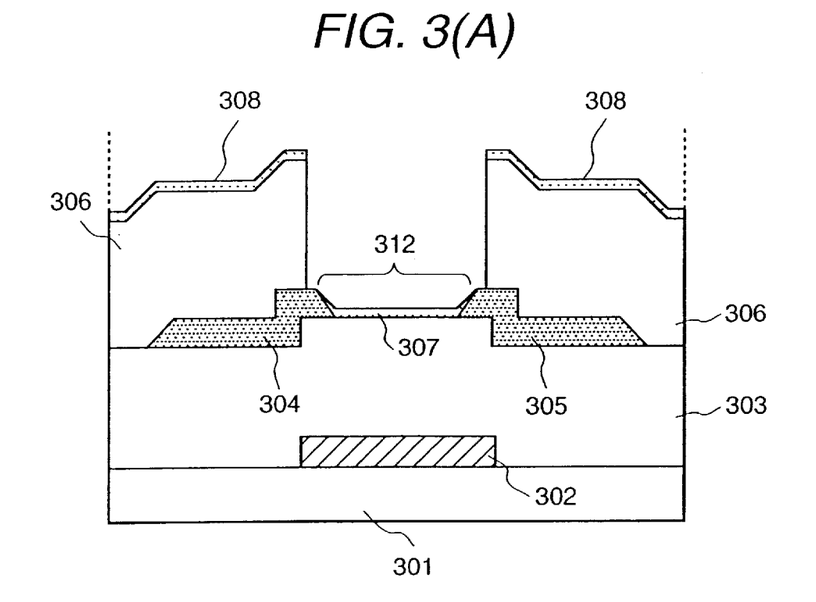
FIG. 3(A) is a schematic cross sectional view and FIG. 3(B) is a schematic plan view of an organic TFT element representing a second embodiment of the present invention.
Figure 3B:
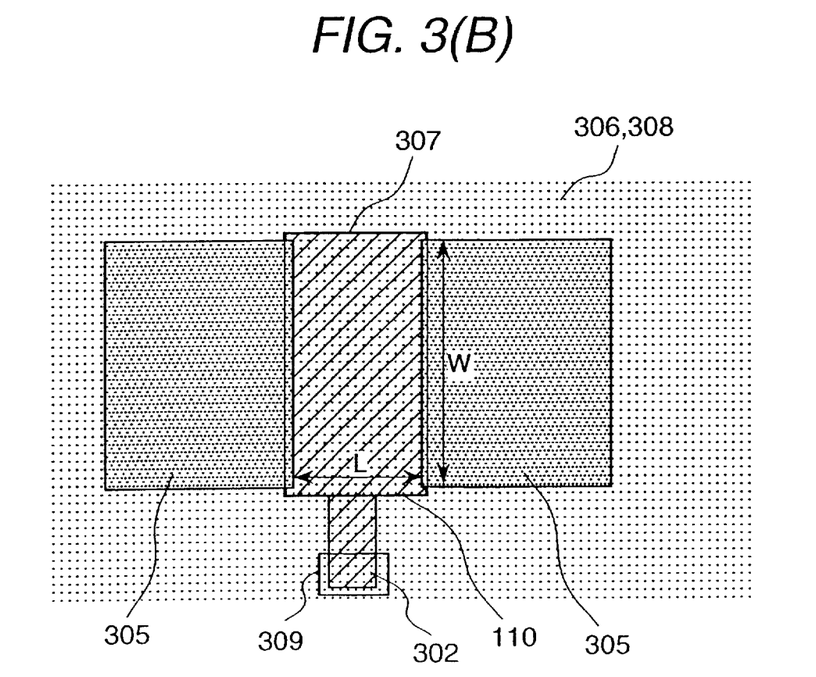

FIG. 3(A) is a schematic cross sectional view of the structure of the organic TFT element representing an embodiment 2. FIG. 3(B) is a partial plan view of the structure of the organic TFT element in the embodiment 2. The organic TFT element has a glass substrate 301, a gate electrode 302, a gate insulating film 303, a source electrode 304, a drain electrode 305, a patterned insulating film 306 made of a photosensitive organic insulating film, a a-6T organic semiconductor film 307 in a channel region, the a-6T organic semiconductor film 308 in a non-channel region, an opening 309 for taking out the gate electrode, and a region 310 where the photosensitive organic insulating film has been removed. That is, the patterned insulating film 306 made of the photosensitive insulating material is formed between the gate insulating film 303 and the organic semiconductor layer (organic semiconductor film 307), and the insulating film in the region 312 above or beneath (in the present embodiment, above) the gate electrode 302 is removed. The region where the insulating film has been removed has the same size as the channel region of the gate electrode 302.

As indicated in FIG. 3(B), the source electrode 304 and the drain electrode 305 each have a width of W and are arranged with an interval L. The gate electrode 302 is led out from one side and is connected to the outside via the opening for taking out the gate electrode 309. The organic semiconductor film 307 is composed so as to contact the slanting portion at the end of the source electrode 304 and the drain electrode 305.

Figure 4A:
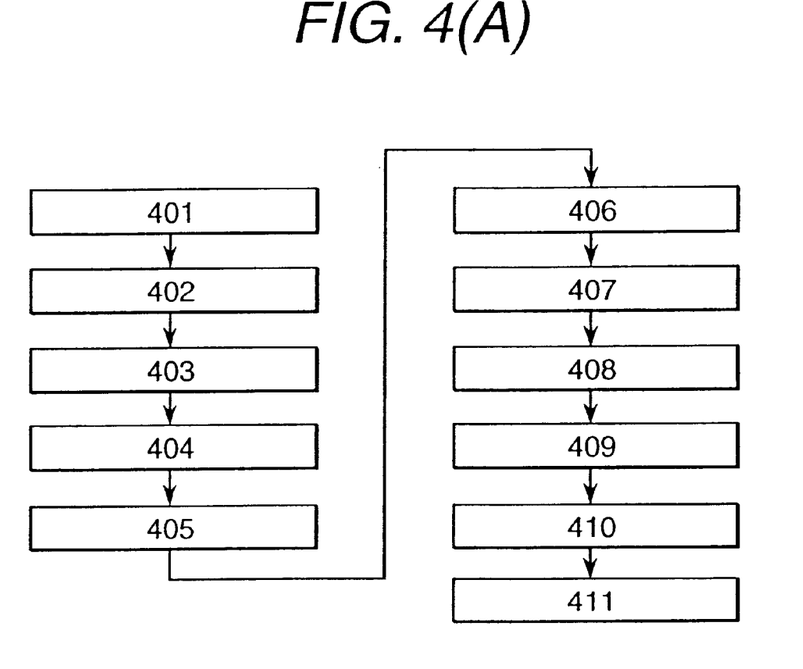
FIG. 4(A) and FIG. 4(B) are flow diagrams illustrating the process of manufacture of the organic TFT element representing the second embodiment.
Figure 4B:
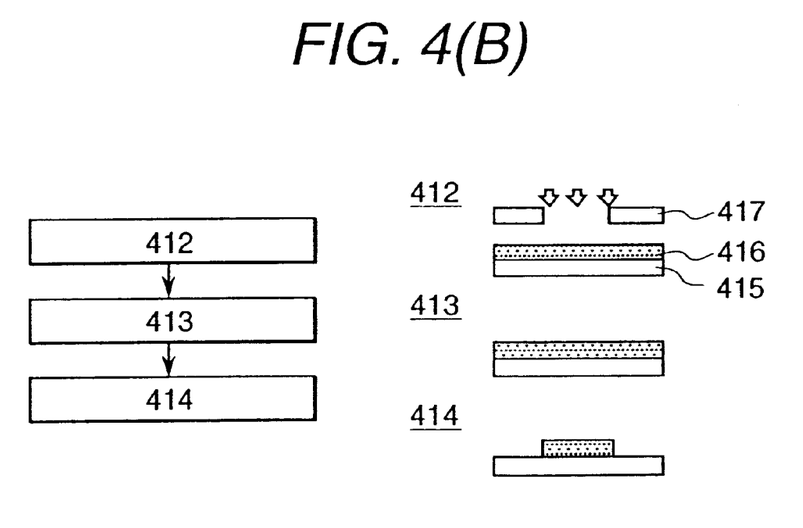

The steps (steps 401–411) in the manufacture of the organic TFT, the composition of which is indicated in FIG. 3(A), are indicated in FIG. 4(A). Steps of the photolithography used in the process indicated in FIG. 4(A) are indicated in FIG. 4(B) (steps 412–416).

The methods used in the manufacture of the gate electrode 302, which is formed on the glass substrate 301 made of Corning 1737 glass, the gate insulating film 303 made of SiO$_2$ of the gate insulating layer, the opening for taking out the gate electrode 309, the source electrode 304, and the drain electrode 305, are as same as the methods used in the embodiment 1 (steps 401–408). An organic insulating film made of benzocyclobutene (BCB) of 2 $\mu$m in thickness is formed thereon by a coating method (step 409). Next, a part of the BCB insulating film is removed by photolithography (step 410). The position and size of the removed region 310 are the same as the position and size of the removed region 110 in the embodiment 1. In accordance with the present embodiment, as indicated in FIG. 4(B), the resist coating step (step 212) and the resist peeling step (step 216) can be shortened in comparison with the general photolithography process of 5 steps indicated in FIG. 2(B), because the BCB insulating film itself operates as the photoresist concurrently, and so the manufacturing process can be simplified.

Subsequently, an a-6T organic semiconductor film of 20 nm in thickness is formed on the BCB insulating film by a vacuum vapor deposition method. The condition for the vapor deposition is the same as that of the embodiment 1. The a-6T organic semiconductor film 307 in the BCB insulating film removed region 310 becomes the channel region by contacting the source electrode 304, the drain electrode 305 or the gate insulating film 303. on the other hand, the a-6T organic semiconductor film 308 on the patterned insulating film 306 made of the BCB insulating film is not in contact with the a-6T organic semiconductor film 307. Therefore, the channel region is patterned to the same size as the size of the gate electrode, and the manufacturing of the organic TFT is completed.

In accordance with the present embodiment, the process for forming the patterned insulating layer removed region can be simplified, and the characteristics of the TFT can be improved by decreasing the off current as in the embodiment 1.

As a result, in accordance with the present invention, the organic semiconductor channel region can be optimized by inserting the patterned photosensitive organic insulating layer between the source/drain electrode and the organic semiconductor layer, and a high performance organic TFT element can be obtained.

(Embodiment 3)

Next, an embodiment, wherein the organic TFT element relating to the present invention is used in an active matrix liquid crystal display apparatus, will be explained with reference to FIG. 5 to FIG. 7.

Figure 5:
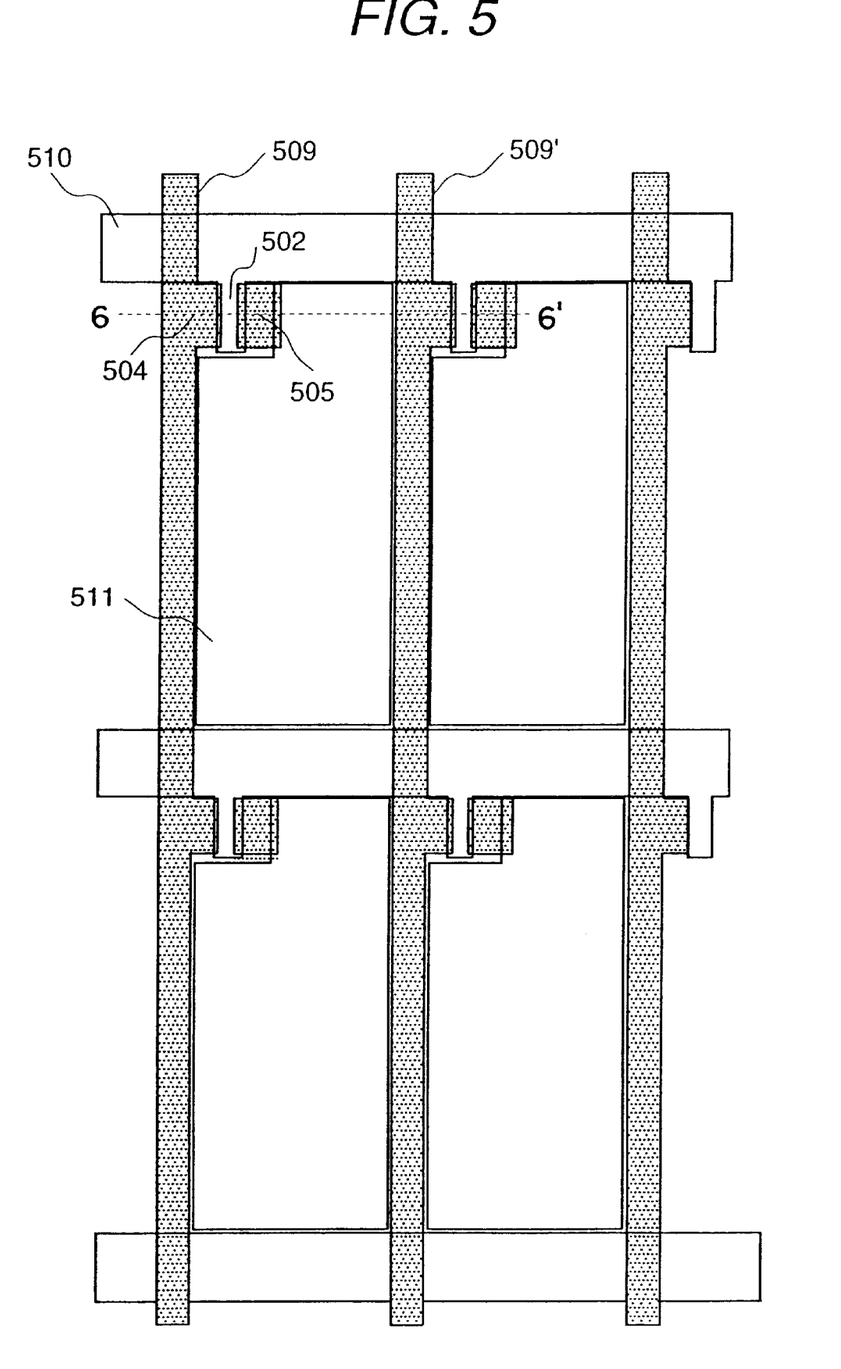
FIG. 5 is a schematic plan view indicating the fundamental composition of the active matrix liquid crystal, display apparatus using the organic TFT element of the present invention.

FIG. 5 illustrates an active matrix liquid crystal display apparatus relating to the present invention. FIG. 6 is a schematic cross sectional view of the active matrix liquid crystal display apparatus taken along the line A–A' in FIG. 5. The apparatus has a glass substrate 501, a gate electrode 502, a gate insulating film 503, a source electrode 504, a drain electrode 505, a patterned insulating film 506, an a-6T organic semiconductor film 507 in the channel region, an a-6T organic semiconductor film 508 in the non-channel region, signal lines 509 and 509, a scanning line 510, a pixel electrode 511, a $SiO_x$ protection film 512, orientation films 513 and 513, a counter electrode 515, a liquid crystal composition 516, a spacer bead 517, polarizers 518 and 518', a TFT substrate 519, and a counter substrate 520.

Figure 6:
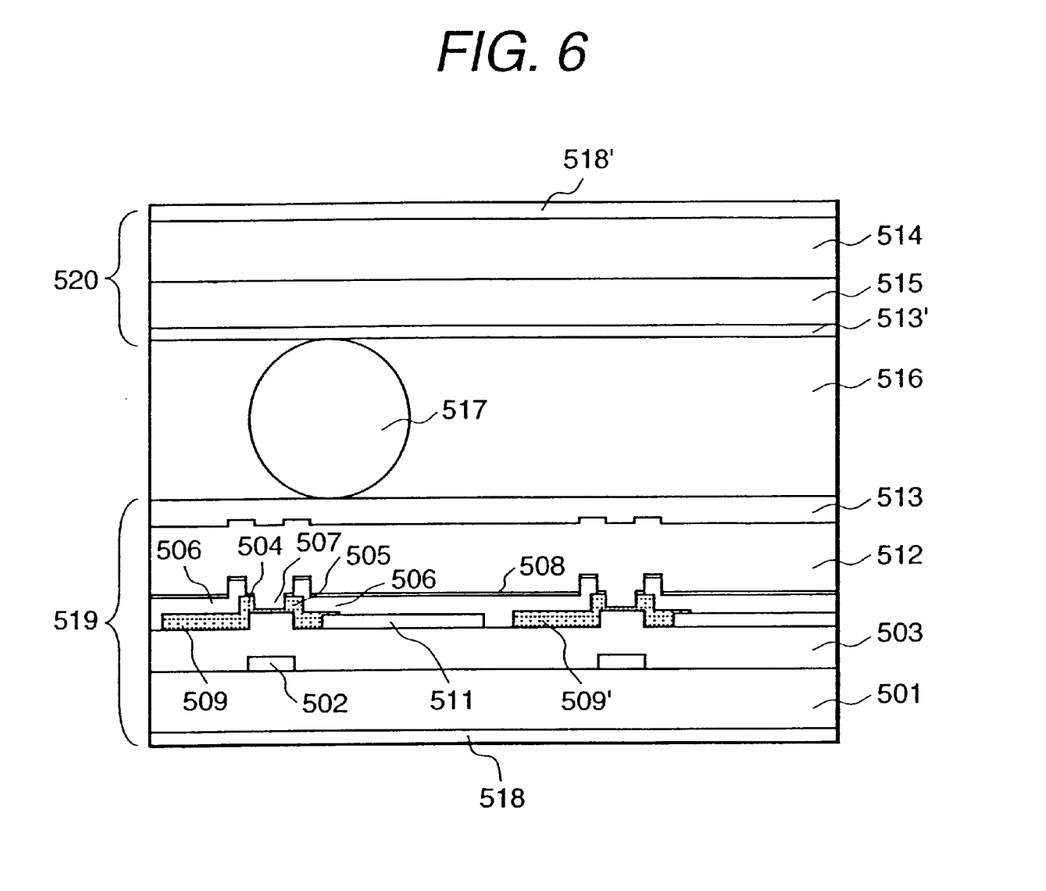
FIG. 6 is a schematic cross sectional view of the structure of the pixel portion taken along the line A–A' in FIG. 5.
Figure 7A:
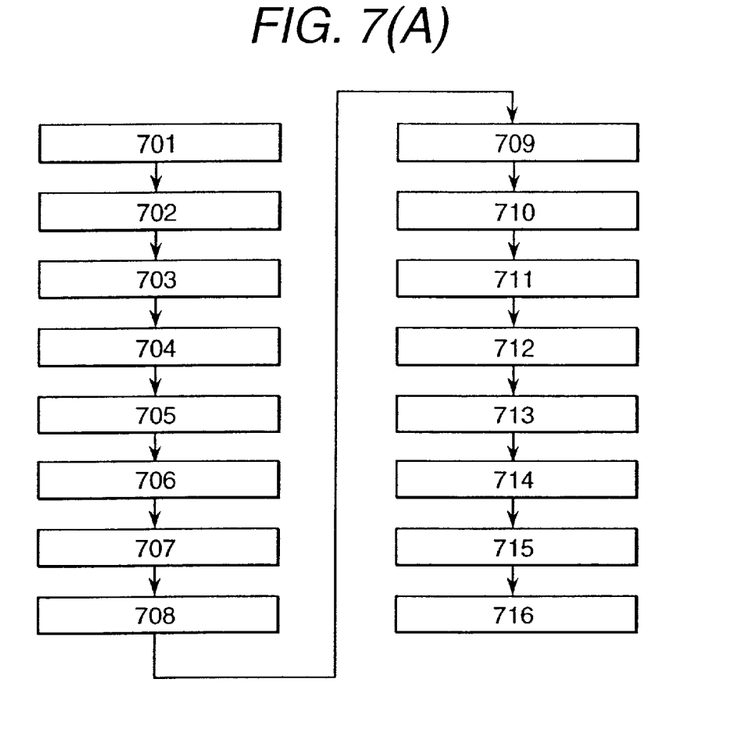
FIGS. 7(A), 7(B), and 7(C) are flow diagrams illustrating the process of manufacture of the organic TFT element representing a third embodiment of the present invention.
Figure 7B:
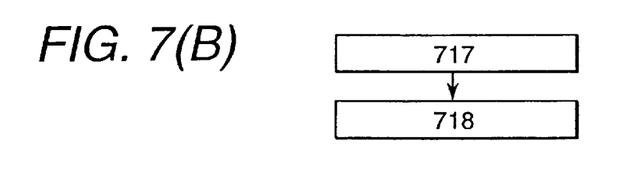

The steps (steps 701–722) in the manufacture of the active matrix liquid crystal display apparatus indicated in FIG. 5 and FIG. 6, are shown in FIG. 7(A), FIG. 7(B) and FIG. (C).

First, a TFT substrate 519 is manufactured by the steps indicated in FIG. 7(A).

A CrMo film of 150 nm in thickness is formed on a glass substrate 501 made of Corning 1737 glass by a spattering method (step 701). The scanning lines 510 and the gate electrodes 502 are formed by patterning the CrMo film by photolithography (step 702). The gate insulating film 503 made of $SiO_2$ of 300 nm in thickness is formed thereon by a CVD method (step 703). An ITO thin film of 300 nm in thickness is formed thereon by a spattering method, and the pixel electrodes 511 are formed by patterning the ITO thin film with photolithography (step 705, 706). The signal lines 509, the source electrodes 504, and the drain electrodes 505 are formed thereon by patterning an Au thin film of 150 nm in thickness, which has been formed by vapor deposition, by photolithography (step 709, 710). In order to increase the adhesiveness of the Au film with the $SiO_2$ film, a CrMo pattern of 20 nm in film thickness is inserted between the Au film and the $SiO_2$ film, as in embodiment 1 (step 707, 708). The patterned insulating film, which is made of $SiN_X$ of approximately 500 nm in thickness is formed thereon by a CVD method (step 711). A part of the $SiN_X$ insulating film is removed by photolithography, as in embodiment 1 (step 712), and the a-6T organic semiconductor vapor deposited film of 20 nm in thickness is formed thereon (step 713). A $SiO_X$ vapor deposited film of 500 nm in thickness is formed thereon as a protection film 512 (step 714). The orientation film 513 of approximately 200 nm in thickness is formed thereon by a spin coating method (step 716), and the TFT substrate 519 is completed.

Then, in accordance with the operation steps indicated in FIG. 7(B), the counter substrate 520 is manufactured. The ITO counter electrodes 515 of 140 nm in thickness are formed on the glass substrate 514 made of Corning glass 1737 by a spattering method (step 717). The orientation film 513' of 200 nm in thickness is formed thereon by a spin coating method (step 718).

Figure 7C:
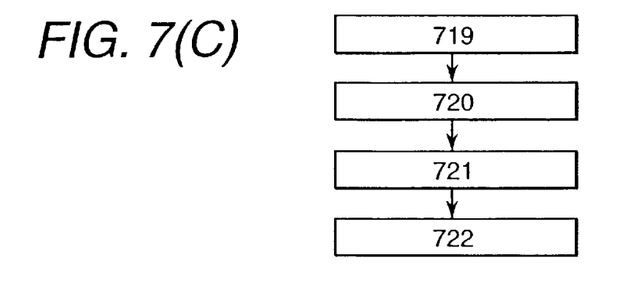

The liquid crystal panel is manufactured in accordance with the operation steps indicated in FIG. 7(C). After orientation treatment of the surface of the orientation films 513 and 513' on each of the TFT substrate 519 and the counter substrate 520 (step 719), spacer beads 517, which are composed of silicon oxide having a diameter of approximately 4 μm, are dispersed on the surface of the TFT substrate 519 (step 720). The liquid crystal composition 519 is sealed into a cell gap formed by holding the TFT substrate 519 and the counter substrate 520 in parallel (step 721). The liquid crystal panel is completed by adhering the polarizers 518, 518' onto respective surfaces of the TFT substrate 519 and the counter substrate 520 (step 722).

In accordance with the present embodiment, the off current was decreased by one order, because the a-6T organic semiconductor film 507 in the channel region was patterned to have the same size as the gate electrode by the presence of the patterned insulating film 506, as in the embodiment 1.

The a-6T organic semiconductor film 508 existed in the region between the drain electrode 505 and the adjacent signal line 509' indicated in FIG. 5 and FIG. 6, but no TFT operation by the drain electrode 505 and the adjacent signal line 509' occurred, because of the presence of the insulating film 506. Accordingly, no writing-in by the adjacent signal line occurred.

As a result, in accordance with the present invention, an organic TFT element, wherein the organic semiconductor channel region is patterned, can be obtained by providing the insulating layer between the source electrodes (or drain electrodes) and the organic semiconductor film, and an active matrix liquid crystal display apparatus, wherein cross talking among lines hardly occurs, can be obtained.

The organic TFT element can be used as an active element for an IC card. In this case, the organic TFT element can be mounted onto the substrate by replacing the glass substrate 101, which is generally made of Corning 1737, with a plastic substrate made of polymers.

As described above, the performance of the organic TFT element can be improved preferably by providing thin film transistor, wherein the semiconductor channel region is patterned.

Practically, gate electrodes 102, gate insulating film 103, source electrodes 104, and drain electrodes 105 are formed on a glass substrate 101. A patterned insulating film is formed thereon, and a part of the film in the region 110 on the gate electrode is removed. An organic semiconductor film is formed thereon by vapor deposition. The organic semiconductor film 107 in the region 110, where the patterned insulating film was removed, becomes a channel region and is separated from the organic semiconductor film 108 on the patterned insulating film 106. Therefore, the organic semiconductor channel region is patterned to have the same size as the gate electrode.

Accordingly, a thin film transistor, wherein the semiconductor region is patterned precisely, becomes available; the semiconductor channel region is optimized; and improvement in performance of the thin film transistor using an organic semiconductor film can be achieved. In accordance with the present invention, the semiconductor region of an organic TFT element can be optimized, drain off current can be decreased, and writing into the liquid crystal pixel by an adjacent line in the active matrix liquid crystal display apparatus becomes avoidable.

What is claimed is:

1. An IC card apparatus comprising:
   gate electrodes,
   a gate insulating film,
   source electrodes,
   drain electrodes, and
   a semiconductor layer,
   on a substrate, and
   wherein a patterned insulating layer is located between said gate insulating film and said semiconductor layer, except for a channel region.

2. An IC card apparatus as claimed in claim 1 wherein said semiconductor layer is an organic semiconductor layer.

3. An IC card apparatus as claimed in claim 1, wherein said patterned insulating layer is a photosensitive insulating film.

4. An IC card apparatus as claimed in claim 1, wherein said substrate is a plastic substrate.

5. An IC card apparatus as claimed in claim 4, wherein said plastic substrate is made of polymer material.

6. An IC card apparatus as claimed in claim 1, wherein the channel region, where the patterned insulating layer is not located, has a size which is a same size as a gate electrode, of the gate electrodes.

7. An IC card apparatus as claimed in claim 1, wherein material of the gate insulating film is different from material of the patterned insulating layer.

8. A process for forming a liquid crystal display apparatus, comprising the steps of:
   (a) forming a gate electrode and scan lines on a substrate,
   (b) forming a gate insulating film,
   (c) forming source electrodes, drain electrodes, and data lines,
   (d) forming a semiconductor layer,
   (e) forming a patterned insulating layer located between said gate insulating film and said semiconductor layer, except for a channel region,
   (f) forming image element electrodes, a protecting layer, and an oriented film,
   (g) forming a counter substrate, and
   (h) providing a liquid crystal between the substrate and the counter substrate.

9. A process as claimed in claim 8, wherein the steps are performed with the following steps in the sequence of steps (a), (b), (c), (e), (d), (f), (g) and (h).

10. A process as claimed in claim 8, wherein the patterned insulating layer is made of material different from material of the gate insulating film.

11. A process as claimed in claim 8, wherein the patterned insulating layer is made from a photosensitive film.

12. A process as claimed in claim 11, wherein the patterned insulating layer is formed by forming a film of material for forming the patterned insulating layer and removing a part of said film at said channel region.

13. A process as claimed in claim 8, wherein the patterned insulating layer is formed by forming a film of material for forming the patterned insulating layer and removing a part of said film at said channel region.

14. A process for forming a semiconductor apparatus comprising the steps of:
   (a) forming a gate electrode,
   (b) forming a gate insulating film,
   (c) forming source electrodes, and drain electrodes,
   (d) forming a semiconductor layer, and
   (e) forming a patterned insulating layer located between said gate insulating film and said semiconductor layer, except for a channel region.

15. A process as claimed in claim 14, wherein the steps are performed in the sequence of steps (a), (b), (c), (e) and (d).

16. A process as claimed in claim 14, wherein the patterned insulating layer is made of material different from material of the gate insulating film.

17. A process as claimed in claim 14, wherein the patterned insulating layer is made from a photosensitive film.

18. A process as claimed in claim 17, wherein the patterned insulating layer is formed by forming a film of material for forming the patterned insulating layer and removing a part of said film at said channel region.

19. A process as claimed in claim 14, wherein the patterned insulating layer is formed by forming a film of material for forming the patterned insulating layer and removing a part of said film at said channel region.

* * * * *